(12) United States Patent
Takahashi et al.

(10) Patent No.: US 10,395,809 B2
(45) Date of Patent: Aug. 27, 2019

(54) PERPENDICULAR MAGNETIC LAYER AND MAGNETIC DEVICE INCLUDING THE SAME

(71) Applicants: Samsung Electronics Co., Ltd., Suwon-si, Gyeonggi-do (KR); National Institute for Materials Science, Ibaraki (JP)

(72) Inventors: Shigeki Takahashi, Yokohama (JP); Yoshiaki Sonobe, Yokohama (JP); Hiroaki Sukegawa, Tsukuba (JP); Hwachol Lee, Tsukuba (JP); Kazuhiro Hono, Tsukuba (JP); Seiji Mitani, Tsukuba (JP); Jun Liu, Tsukuba (JP)

(73) Assignees: Samsung Electronics Co., Ltd., Gyeonggi-do (KR); National Institute for Materials Science, Ibaraki (JP)

( * ) Notice: Subject to any disclaimer, the term of this patent is extended or adjusted under 35 U.S.C. 154(b) by 0 days.

(21) Appl. No.: 15/591,348

(22) Filed: May 10, 2017

(65) Prior Publication Data

US 2017/0330668 A1   Nov. 16, 2017

(30) Foreign Application Priority Data

May 10, 2016   (JP) .................................. 2016-094864

(51) Int. Cl.
*H01F 10/12*   (2006.01)
*H01F 10/06*   (2006.01)
(Continued)

(52) U.S. Cl.
CPC ............. *H01F 10/12* (2013.01); *H01F 10/06* (2013.01); *H01F 10/123* (2013.01); *H01F 10/26* (2013.01);
(Continued)

(58) Field of Classification Search
CPC .......... H01F 10/06; H01F 10/12; H01F 10/26; H01L 43/12; H01L 43/08; H01L 43/10
See application file for complete search history.

(56) References Cited

U.S. PATENT DOCUMENTS 8,772,846 B2   7/2014   Park et al.
8,895,162 B2   11/2014   Nishiyama et al.
(Continued)

FOREIGN PATENT DOCUMENTS

JP   200954776 A   3/2009
JP   2010232499 A   10/2010
(Continued)

OTHER PUBLICATIONS

D. Fruchart et.al "Magnetic Studies of the Metallic Perovskite-Type Compounds of Manganese" Journal of the physical society of Japan, vol. 44, No. 3 Mar. 1978.
(Continued)

*Primary Examiner* — Hrayr A Sayadian
(74) *Attorney, Agent, or Firm* — Harness, Dickey & Pierce, P.L.C.

(57) ABSTRACT

Embodiments of the inventive concepts provide a flat perpendicular magnetic layer having a low saturation magnetization and a perpendicular magnetization-type tunnel magnetoresistive element using the same. The perpendicular magnetic layer is a nitrogen-poor $(Mn_{1-x}Ga_x)N_y$ layer ($0<x\leq0.5$ and $0<y<0.1$) formed by providing nitrogen (N) into a MnGa alloy while adjusting a nitrogen amount. The perpendicular magnetic layer can be formed flat.

20 Claims, 12 Drawing Sheets

(51) Int. Cl.
  *H01F 10/26* (2006.01)
  *H01L 43/08* (2006.01)
  *H01L 43/10* (2006.01)
  *H01L 43/12* (2006.01)
  *H01F 10/30* (2006.01)
  *H01F 10/32* (2006.01)

(52) U.S. Cl.
  CPC ......... *H01F 10/30* (2013.01); *H01F 10/3286* (2013.01); *H01L 43/08* (2013.01); *H01L 43/10* (2013.01); *H01L 43/12* (2013.01); *H01F 10/3254* (2013.01)

(56) References Cited

U.S. PATENT DOCUMENTS

| | | | |
|---|---|---|---|
| 8,993,134 B2 | 3/2015 | Varaprasad et al. | |
| 9,276,198 B2 | 3/2016 | Lim et al. | |
| 9,842,636 B2* | 12/2017 | Sukegawa | G11C 11/161 |
| 2012/0313191 A1* | 12/2012 | Whig | H01L 43/08 257/421 |
| 2014/0077319 A1 | 3/2014 | Noma et al. | |
| 2016/0314825 A1* | 10/2016 | Sukegawa | G11C 11/161 |

FOREIGN PATENT DOCUMENTS

| | | |
|---|---|---|
| JP | 2013038421 A | 2/2013 |
| JP | 2014049766 A | 3/2014 |
| JP | 2014060297 A | 4/2014 |
| WO | WO-2014004398 A1 | 1/2014 |

OTHER PUBLICATIONS

Claude Chappert "The emergence of spin electronics in data storage" Nature Materials, vol. 6 Nov. 2007.

Akio Yakushiji "Ultralow-Voltage-Spin-Transfer Switching in Perpendiculary Magnetized Magnetic Tunnel Junctions with Synthetic Antiferromagnetic Reference Layer" National Institute of Advanced Industrial Science and Technology (AIST) Nov. 1, 2013.

S. Mizukami "Long-Lived Ultrafast Spin Precession in Manganese Alloys Films with a Large Perpendicular Magnetic Anistrophy" Ameican Physical Society Mar. 2011.

H.Lee "Ferromagnetic MnGaN thin films with perpendicular magnetic anisotropy for spintronics applications" American Institute of Physics, Jul. 2015.

* cited by examiner

PERPENDICULAR MAGNETIC LAYER AND MAGNETIC DEVICE INCLUDING THE SAME

CROSS-REFERENCE TO RELATED APPLICATION

This U.S. non-provisional patent application claims priority under 35 U.S.C. § 119 to Japanese Patent Application No. JP2016-094864, filed on May 10, 2016, in the Japanese Patent Office, the disclosure of which is hereby incorporated by reference in its entirety.

BACKGROUND

Embodiments of the inventive concepts relate to a perpendicular magnetic layer and a perpendicular magnetic layer structure, which have a ferromagnetic property. In addition, embodiments of the inventive concepts relate to a magnetoresistive element and a perpendicular magnetic recording medium, which use the perpendicular magnetic layer structure.

A perpendicular magnetic layer magnetized in a direction perpendicular to a surface of the layer attracts attention as an information recording layer with the development of high-density and large-capacity magnetic storage or memory devices such as a magnetic disk device (a hard disk) or a non-volatile magnetic random access memory (MRAM) device. A perpendicular magnetic material having a high magnetic anisotropy energy density ($K_u$) is needed to improve a recording density by miniaturizing the recording medium of the hard disk or a tunnel magnetoresistive element (e.g., a magnetic tunnel junction (MTJ) element) of the MRAM device, which uses the perpendicular magnetic layer. The MTJ element makes a recording bit of the MRAM device. In particular, in the MTJ element, a low saturation magnetization and a characteristic capable of easily forming a flat layer are needed together with the high Ku. The low saturation magnetization is need to reduce a characteristic change of the MTJ element by a leakage magnetic field of the perpendicular magnetic layer or to reduce the influence of the leakage magnetic field on neighboring elements. The flat layer is needed to form the MTJ element having a multi-layered structure without a height difference. In addition, when the perpendicular magnetic layer is used as the information recording layer of the MTJ element for the MRAM device, it is required to reduce power consumption of an information recording operation using a current flowing through the MTJ element (i.e., a spin-transfer-torque (STT) recording operation). To achieve this, the perpendicular magnetic layer needs to have a low magnetic damping constant. Naturally, the perpendicular magnetic layer needs to have a ferromagnetic transition temperature (Curie temperature) much higher than a room temperature.

For example, a cobalt-based alloy material such as a cobalt-platinum-chromium (Co—Pt—Cr) alloy has been known as the perpendicular magnetic layer of a perpendicular magnetic recording medium. In addition, a Lb $1_0$-type iron-platinum (FePt) alloy having a very high magnetic anisotropy energy density ($K_u$) is used in patent document 1. An atomic alternating laminated layer of Co and Pt is used as the perpendicular magnetic layer of the MTJ element in non-patent document 1. This is a structure obtained by applying a high magnetic anisotropy energy density ($K_u$) of a CoPt alloy.

However, since the known perpendicular magnetic materials include noble metals, they are expensive and generally have great magnetic damping. Meanwhile, a manganese-gallium alloy having small magnetic damping and not using a noble metal is considered as a candidate material of the perpendicular magnetic layer (non-patent document 2). However, since it is difficult to form the manganese-gallium alloy material into a flat layer, it is difficult to improve the quality of a magnetic recording medium or MTJ element using this material.

In non-patent document 3, a homogeneous manganese-gallium-nitrogen (MnGaN) layer having a cubic system ($E2_1$-type) structure may be obtained by introducing nitrogen into a MnGa alloy layer, a perpendicular magnetic layer may be formed using this layer, and a very flat layer may be obtained at a high formation temperature of about 500 degrees Celsius. However, a magnetic anisotropy energy density ($K_u$) of this layer is as small as a fraction of a magnetic anisotropy energy density ($K_u$) of a $D0_{22}$-type MnGa alloy not including nitrogen.

[Patent document 1] WO 2014/004398 A1

[Non-patent document 1] "Ultralow-Voltage Spin-Transfer Switching in Perpendicularly Magnetized Magnetic Tunnel Junctions with Synthetic Antiferromagnetic Reference Layer", Appl. Phys. Express, Vol. 6, No. 11, p113006 (2013), K. Yakushiji, A. Fukushima, H. Kubota, M. Konoto, and S. Yuasa.

[Non-patent document 2] "Long-Lived Ultrafast Spin Precession in Manganese Alloys Films with a Large Perpendicularly Magnetic Anisotropy", Phys. Rev. Lett., Vol. 106, No. 11, p117201 (2011), S. Mizukami, F. Wu, A. Sakuma, J. Walowski, D. Watanabe, T. Kubota, X. zhang, H. Naganuma, M. Oogane, Y. Ando, and T. Miyazaki.

[Non-patent document 3] "Ferromagnetic MnGaN thin films with perpendicular magnetic anisotropy for spintronics applications", Appl. Phys. Lett, Vol. 107, No. 3, p. 032403 (2015), H. Lee, H. Sukegawa, J. Liu, T. Ohkubo, S. Kasai, S. Mitani, and K. Hono.

[Non-patent document 4] "Magnetic Studies of the Metallic Perovskite-Type Compounds of Manganese", J. Phys. Soc. Jpn., Vol. 44, No. 3, pp. 781-791 (1978), D. Fruchart and E. F. Bertaut.

SUMMARY

Embodiments of the inventive concepts may provide a MnGa alloy having a low magnetic damping constant, which is applied to a MTJ element for a MRAM device.

Embodiments of the inventive concepts may also provide a perpendicular magnetic layer and a perpendicular magnetic layer structure, each of which has both high flatness and high magnetic anisotropy, and a perpendicular magnetization-type MTJ element using the perpendicular magnetic layer structure.

In studying a MnGa alloy-based perpendicular magnetic layer, the inventors of the inventive concepts found that a uniform nitride Mn—Ga—N was formed by a reactive sputtering method in which a very small amount of nitrogen was introduced into a MnGa layer. In particular, the inventors found that a perpendicular magnetic layer having a ferromagnetic property was formed when a nitrogen ratio was small. A $Mn_3GaN$ perovskite-type compound is known as MnGa nitride. However, since this does not have spontaneous magnetization to a paramagnetic property or an anti-ferromagnetic property at room temperature, it is not a natural perpendicular magnetic layer (Non-patent document 4). However, since a $D0_{22}$-$Mn_3Ga$ structure of MnGa is maintained by introducing a very small amount of nitrogen, the Mn—Ga—N perpendicular magnetic layer may be formed extremely flat, as compared with the MnGa layer. In addition, the Mn—Ga—N perpendicular magnetic layer may have a high magnetic anisotropy energy density ($K_u$). Furthermore, even though the layer includes germanium (Ge) instead of Ga, substantially the same effects may be obtained.

Embodiments of the inventive concepts may provide a new perpendicular magnetic layer. The perpendicular magnetic layer may be represented by a composition formula (or chemical formula) of $(Mn_{1-x}M_x)N_y$, where 'M' is at least one of Ga or Ge, $0<x\leq0.5$, and $0<y<0.1$. The perpendicular magnetic layer may have a $D0_{22}$ crystal structure or a $L1_0$ crystal structure similar to the $D0_{22}$ crystal structure.

In addition, embodiments of the inventive concepts may provide a new perpendicular magnetic layer structure in which the perpendicular magnetic layer is disposed on a substrate or an underlayer (e.g., a non-magnetic layer or an electrically conductive layer) disposed on the substrate. This structure may further include a non-magnetic layer disposed on the perpendicular magnetic layer. Moreover, embodiments of the inventive concepts may provide a perpendicular magnetization-type magnetic tunnel junction (MTJ) element structure in which a first perpendicular magnetic layer, a tunnel barrier layer and a second perpendicular magnetic layer are stacked on a substrate or an underlayer (e.g., a non-magnetic layer or an electrically conductive layer) disposed on the substrate. The first perpendicular magnetic layer is the perpendicular magnetic layer described above, and the second perpendicular magnetic layer is the perpendicular magnetic layer described above or another kind of a perpendicular magnetic layer. The perpendicular MTJ element structure may further include an upper electrode disposed on the second perpendicular magnetic layer.

Embodiments of the inventive concepts may provide methods of manufacturing the perpendicular magnetic layer and the perpendicular magnetic layer structure described above. In the manufacturing method, the perpendicular magnetic layer described above is formed on a substrate by a vapor deposition method. The vapor deposition method may be a sputtering method, a plasma method, a vacuum deposition method, or any combination thereof. In particular, the vapor deposition method may be the sputtering method. In the sputtering method, a substrate may be heated, a target material (e.g., MnGa) may be used, and an inert gas (e.g., an argon gas) and a $N_2$ gas may be mixed with each other and be provided. Therefore, the layer may be deposited. At this time, a nitrogen amount by the $N_2$ gas may be adjusted.

BRIEF DESCRIPTION OF THE DRAWINGS

The inventive concepts will become more apparent in view of the attached drawings and accompanying detailed description.

DETAILED DESCRIPTION OF THE EMBODIMENTS

A perpendicular magnetic layer according to some embodiments of the inventive concepts may have a composition formula (or a chemical formula) of $(Mn_{1-x}M_x)N_y$ (where $0<x\leq0.5$, $0<y<0.1$). A metal element 'M' may be gallium (Ga). Alternatively, the metal element 'M' may be germanium (Ge) instead of Ga. The metal element (or metal atom) is selected depending on whether a $Mn_{1-x}M_x$ alloy before nitrification has a $D0_{22}$ structure or a $L1_0$ structure. Here, the $L1_0$ structure is a crystal structure very similar to the $D0_{22}$ structure. A composition of $Mn_{75}M_{25}$ in the $Mn_{1-x}M_x$ alloy may have a rigid $D0_{22}$ structure. However, as an M composition ratio increases, some of sites of Mn may be replaced with M, and thus the $Mn_{75}M_{25}$ may be continuously changed into $Mn_{50}M_{50}$ having the $L1_0$ structure. As a result, the $Mn_{1-x}M_x$ alloy may have the $L1_0$ structure. All of these structures may have strong perpendicular magnetic anisotropy.

In some embodiments, the metal element 'M' may include both Ga and Ge, and magnetic characteristics may be adjusted by changing a composition ratio of Ga and Ge. Because the Mn-M alloy before the nitrification includes the $D0_{22}$-type or $L1_0$-type composition, 'x' is greater than 0 and equal to or less than 0.5 ($0<x\leq0.5$). In addition, 'y' is less than 0.1 ($y<0.1$) because the $D0_{22}$ or $L1_0$ structure is stabilized by a nitrogen amount less than a 'y' range of 0.1 to 0.2 ($0.1\leq y\leq0.2$) in which an $E2_1$ perovskite structure having a stoichiometric composition of $(Mn_{1-x}M_x)_4N$ is stably obtained, and because Curie temperature and magnetic characteristics are maintained high.

The perpendicular magnetic layer of the inventive concepts may have a nitrogen (N)-poor composition ratio like the composition described above, as compared with $Mn_3MN$.

A perpendicular magnetic layer structure and a perpendicular magnetization-type tunnel magnetoresistive element (e.g., magnetic tunnel junction (MTJ) element) structure of the inventive concepts may have the perpendicular magnetic layer described above.

Hereinafter, embodiments of the inventive concepts will be described in more detail by using the perpendicular magnetic layer including gallium (used as the metal element 'M' in the aforementioned composition) as an example.

(A) Basic Structure

Figure 1:
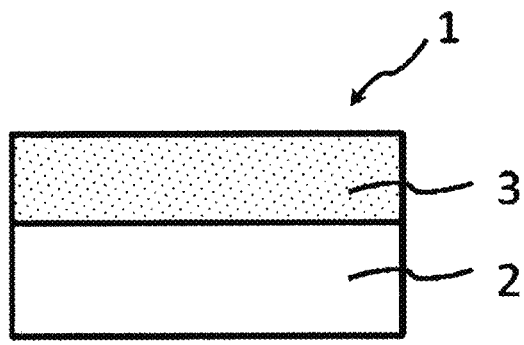
FIG. 1 is a cross-sectional view illustrating a structure of a perpendicular magnetic layer structure according to some embodiments of the inventive concepts.
Figure 2:
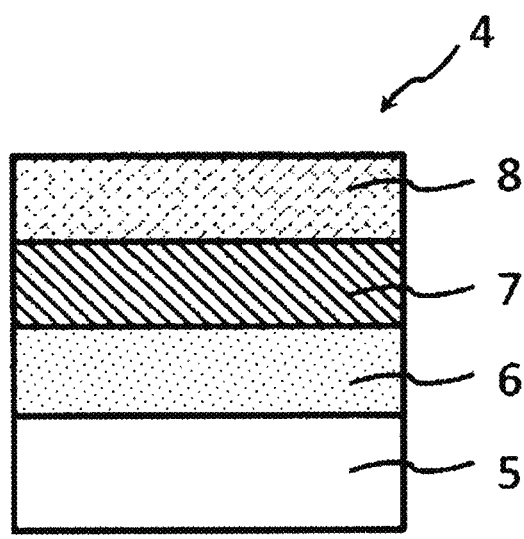
FIG. 2 is a cross-sectional view illustrating a structure of a perpendicular magnetic layer structure according to some embodiments of the inventive concepts.
Figure 3:
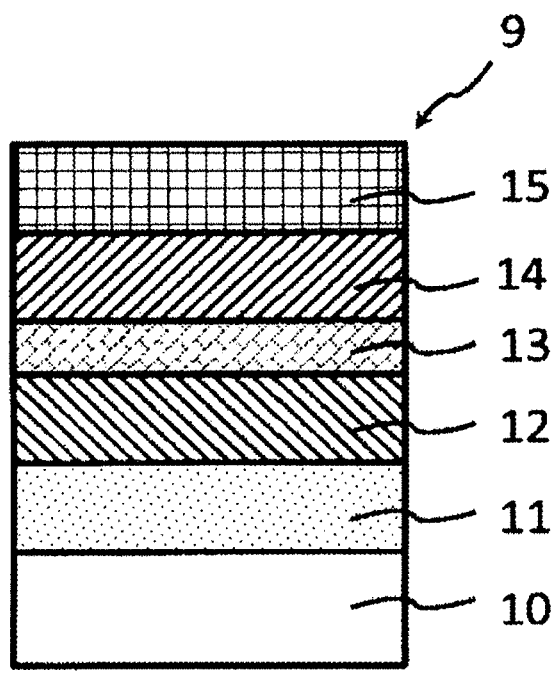
FIG. 3 is a cross-sectional view illustrating a structure of a perpendicular magnetization-type MTJ element according to some embodiments of the inventive concepts.

FIGS. 1, 2, and 3 are schematic views illustrating perpendicular magnetic layer structures 1 and 4 and a perpendicular magnetization-type MTJ element 9 according to some embodiments of the inventive concepts.

Referring to FIG. 1, a perpendicular magnetic layer structure 1 according to some embodiments of the inventive concepts may include a substrate 2 and a perpendicular magnetic layer 3. For example, the substrate 2 may be single-crystalline magnesium oxide (MgO) that has a (001) plane orientation and a sodium chloride (NaCl) structure. Alternatively, the substrate 2 may be a poly-crystalline MgO layer oriented in the (001) plane orientation or may use magnesium-titanium oxide ($MgTiO_x$) having the NaCl structure, $SrTiO_3$ having a perovskite structure, or $MgAl_2O_4$ having a spinel structure.

Referring to FIG. 2, in a perpendicular magnetic layer structure 4 according to some embodiments of the inventive concepts, an underlayer 6, a perpendicular magnetic layer 7 and a non-magnetic layer 8 may be sequentially stacked on a substrate 5. The underlayer 6 may be a non-magnetic layer or an electrically conductive layer. The substrate 5 and the perpendicular magnetic layer 7 may be the same as the substrate 2 and the perpendicular magnetic layer 3 of FIG. 1, respectively. For example, the underlayer 6 as the non-magnetic layer or the electrically conductive layer may be an electrically conductive layer formed of chromium (Cr), platinum (Pt), palladium (Pd), ruthenium (Ru) or any alloy thereof, which may be grown on the substrate 5 in a single-crystalline state. Perpendicular magnetic anisotropy of the perpendicular magnetic layer 3 may be improved by disposing an oxide layer (e.g., MgO) as the non-magnetic layer 8. Alternatively, a noble metal layer (e.g., Ru) capable of inhibiting surface damage caused by oxidation may be used as the non-magnetic layer 8.

FIG. 3 is a schematic view illustrating a perpendicular magnetization-type MTJ structure 9 according to some embodiments of the inventive concepts. The perpendicular magnetization-type MTJ structure 9 may include a substrate 10, an underlayer 11, a first perpendicular magnetic layer 12, a non-magnetic layer 13, a second perpendicular magnetic layer 14, and an upper electrode 15. The substrate 10, the underlayer 11 and the first perpendicular magnetic layer 12 may be the same as the substrate 5, the underlayer 6 and the perpendicular magnetic layer 7 of FIG. 2, respectively. Here, the underlayer 11 may not be necessarily required.

Figure 12:
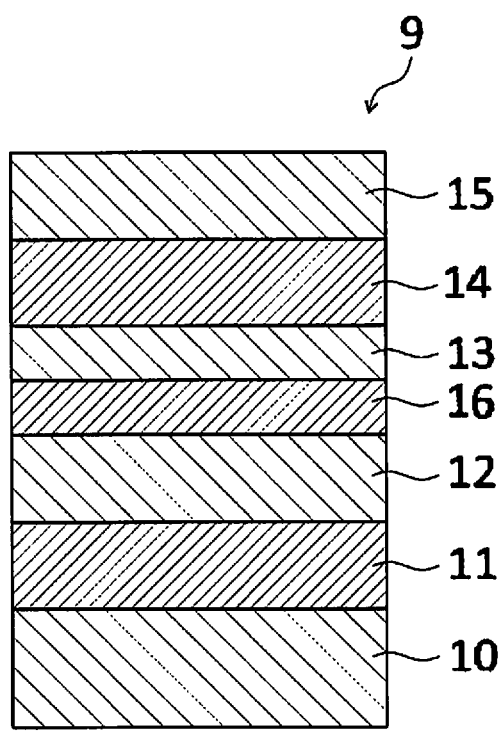
FIG. 12 is a cross-sectional view illustrating a structure of a perpendicular magnetization-type MTJ element according to some embodiments of the inventive concepts.

The non-magnetic layer 13 may be an oxide layer and may act as a tunnel barrier in a MTJ element. In addition, the non-magnetic layer 13 may increase perpendicular magnetic anisotropy of the first perpendicular magnetic layer 12. Hereinafter, the non-magnetic layer 13 is called a tunnel barrier layer. In some embodiments, the tunnel barrier layer 13 may include MgO, spinel ($MgAl_2O_4$), or aluminum oxide ($Al_2O_3$), and a thickness of the tunnel barrier layer 13 may range from about 0.8 nm to about 3 nm. When $MgAl_2O_4$ or $Al_2O_3$ is cubic, it may have a structure including irregular positive ion sites. The tunnel barrier layer 13 may be grown in orientation of a (001) plane and planes equivalent to the (001) plane. As shown in FIG. 12, an insertion layer 16 formed of a cubic material grown with the (001) plane orientation may be disposed between the first perpendicular magnetic layer 12 and the tunnel barrier layer 13 to improve the magnetic characteristics of the first perpendicular magnetic layer 12. For example, the insertion layer 16 formed of the cubic material may include a cobalt (Co)-based full Heusler alloy, a cobalt-iron (CoFe) alloy having a body-centered cubic (BCC) structure, or $Co_{1-x}Fe_x$ (0<x≤1). The full Heusler alloy may have a L21-type structure and have a chemical composition of $Co_2XY$ where 'X' is a transition metal and 'Y' is a typical element. For example, 'X' may be Fe, Cr, Mn, or any alloy thereof and 'Y' may be Al, Si, Ge, Ga, Sn, or any alloy thereof. In some embodiments, the Co-based full Heusler alloy may have a B2 structure in which the X atoms and the Y atoms are irregular, instead of the L21 structure. The CoFe alloy may include a cobalt-iron-boron (CoFeB) alloy including boron.

The second perpendicular magnetic layer 14 may be in direct contact with the tunnel barrier layer 13. The second perpendicular magnetic layer 14 may use the same material or the same kind of a material as the first perpendicular magnetic layer 12 or may use the Co-based full Heusler alloy or the CoFe alloy. In addition, a tetragonal material capable of (001) growth may be applied to the second perpendicular magnetic layer 14. For example, the tetragonal material may include at least one of a $L1_0$-based alloy XY (where X=Fe or Co and Y=Pt or Pd), a $D0_{22}$-type or $L1_0$-type manganese alloy, a manganese-gallium (Mn—Ga) alloy, or a manganese-germanium (Mn—Ge) alloy. In some embodiments, the second perpendicular magnetic layer 14 may include a perpendicular magnetic layer having an amorphous structure, e.g., a terbium-cobalt-iron (Tb—Co—Fe) alloy layer.

The upper electrode 15 may be a metal protective layer disposed on the second perpendicular magnetic layer 14. For example, the upper electrode 15 may include Ta or Ru.

When the perpendicular magnetic layer structure according to some embodiments of the inventive concepts is used as a perpendicular magnetic recording medium, an understructure and the perpendicular magnetic layer may need a thin layer structure composed of micro-crystalline grains in which crystal orientation is oriented. An MgO or $MgTiO_x$ poly-crystalline layer oriented in the (001) plane orientation may be formed on a silicon substrate which includes a thermal oxide layer having an amorphous structure or glass substrate, by a sputtering method, and this layer may be used as a basis of the understructure of the present embodiment. For example, embodiments of the inventive concepts may use a structure including the silicon substrate (including the thermal oxide layer), an MgO layer, a Cr layer, and the perpendicular magnetic layer, which are sequentially stacked.

(B) Manufacturing Method

Methods of manufacturing the perpendicular magnetic layer structures 1 and 4 and the perpendicular magnetization-type MTJ element structure 9 described above will be described hereinafter.

To form the perpendicular magnetic layer 3 of FIG. 1, at least one (e.g., MgO) of the various kinds of oxides having the (001) plane orientation described above may be used as the substrate 2. A thin layer formation apparatus, for example, a super-vacuum magnetron sputtering apparatus (ultimate vacuum degree: 4×10$^{-7}$ Pa) may be used, and a layer (i.e., the perpendicular magnetic layer 3) may be formed using an argon gas and a nitrogen gas as a process gas by a radio-frequency (RF) sputtering method using a Mn—Ga alloy target. For example, a composition of Mn-Ga may be an element ratio of 70%:30%. When the layer is formed, a substrate temperature may range from 400 degrees Celsius to 600 degrees Celsius. A ratio ($\eta$) of a nitrogen gas pressure to an argon gas pressure may be adjusted in a range of, for example, 0.1% to 0.8%, and a sum of the nitrogen gas pressure and the argon gas pressure may be fixed at 0.27 Pa. These gas pressures and the substrate temperature are accurately determined to maintain a low nitrogen (N) composition. A uniform and flat perpendicular magnetic Mn—Ga—N layer of the inventive concepts, which has the $D0_{22}$-type crystal structure such as $D0_{22}$-$M_3Ga$ of Mn—Ga, can be obtained by these conditions. A thickness of the Mn—Ga—N layer may range from 5 nm to 50 nm. However, embodiments of the inventive concepts are not limited thereto. In certain embodiments, the Mn—Ga—N layer may be thinner. Other inert gas (e.g., krypton, neon, or xenon) may be used as the sputtering process gas instead of the argon gas. Other vapor deposition method such as a DC sputtering method or an electron beam deposition method may be used instead of the RF sputtering method. When a ratio of Mn is equal to or greater than 50% in the composition of Mn—Ga, the Mn—Ga alloy may be used as a target material. In some embodiments, the layer may be formed directly from a Mn—Ga—N alloy target of which a nitrogen amount is adjusted.

The perpendicular magnetic layer 7 of FIG. 2 and the perpendicular magnetic layer 12 of FIG. 3 may be formed by the method described above. In a RF sputtering method performed under an argon gas pressure using the magnetron sputtering apparatus in the below embodiment, the substrate temperature may be in a range of 300 degrees Celsius to 600 degrees Celsius, and a nitrogen ($N_2$) amount ($\eta$) with respect to the argon gas pressure may be less than, for example, about 0.7%. Thus, nitrogen of a concentration of 10 at % or less may be introduced into a Mn—Ga layer to manufacture a Mn—Ga—N perpendicular magnetic layer having a $D0_{22}$-type structure or having the $D0_{22}$-type structure as a main body. In this case, the aforementioned $(Mn_{1-x}M_x)N_y$ composition (where M=Ga) according to the nitrogen ($N_2$) amount can be obtained.

In the Mn—Ga—N perpendicular magnetic layer, the parameter 'x' related to a composition ratio of Mn and Ga may be in a range of 0.2 to 0.4. The parameter 'y' related to a composition of nitrogen (N) may be greater than 0 and less than 0.1 (0<y<0.1). In particular, the parameter 'y' may be greater than 0 and less than 0.05 (0<y<0.05). In more particular, the parameter 'y' may be greater than 0 and less than 0.02 (0<y<0.02). However, the parameter 'y' may be considered based on the nitrogen (N2) amount ($\eta$) greater than 0 and less than 0.7% (0 <$\eta$<0.7%).

Formation of the underlayers 6 and 11 of FIGS. 2 and 3 may include using the MgO substrate of the substrate 2 as the substrates 5 and 10, and forming a Cr layer using the sputtering apparatus described above. A substrate temperature may be the room temperature when the layer is formed, and a pure argon gas may be used as a process gas. A gas pressure is, for example, 0.13 Pa. A Cr underlayer grown in the (001) plane orientation in a cubic system may be formed by these conditions. In addition, after the formation of the Cr underlayer, flatness and the crystal structure may be controlled by performing a post heating treatment in a vacuum at a temperature of 200 degrees Celsius to 800 degrees Celsius. The perpendicular magnetic layers 7 and 12 may be formed by the same method as the perpendicular magnetic layer 3.

Next, in the structure of FIG. 3, an MgO layer may be formed as the tunnel barrier layer 13 on the Mn—Ga—N layer. For example, a thickness of the MgO layer may range from about 1 nm to about 2 nm. The MgO layer may be formed by a direct RF sputtering deposition method using an MgO target. Alternatively, magnesium (Mg) may be deposited by a sputtering deposition method, and the deposited magnesium (Mg) may be treated by an oxidation method, thereby forming the MgO layer. After the formation of the MgO layer, a post heating treatment may be performed at about 200 degrees Celsius to improve a crystal quality, and a higher tunnel magnetoresistance (TMR) ratio may be obtained by the improvement of (001) orientation.

In the structure of FIG. 3, next, the second perpendicular magnetic layer 14 may be formed. For example, an amorphous CoFeB layer may be formed as the second perpendicular magnetic layer 14 by a sputtering method. A thickness of the amorphous CoFeB layer may be, for example, 1.3 nm. The upper electrode 15 may be formed on the second perpendicular magnetic layer 14. For example, a stack layer of a Ta layer having a thickness of 5 nm and a Ru layer having a thickness of 10 nm may be formed as the upper electrode 15 by a sputtering method. Boron (B) atoms of the CoFeB layer may be diffused into the Ta layer by the heating treatment, and thus a boron concentration of the CoFeB layer is reduced. As a result, the CoFeB layer is crystallized from the MgO tunnel barrier layer, and thus the crystal structure of the CoFeB layer is changed into a BCC structure of the (001) plane orientation. By this feature, crystal orientations of the first perpendicular magnetic layer 12, the tunnel barrier layer 13 and the second perpendicular magnetic layer 14 may be arranged to the (001) plane to obtain a high TMR ratio. To promote the crystallization, a crystalline CoFe layer having a thickness of 0.1 nm to 0.5 nm may be inserted between the MgO layer and the CoFeB layer.

For example, a Ta layer (about 0.5 nm to about 10 nm), a Ru layer (about 2 nm to about 20 nm), or a Ta/Ru stack layer may be formed as the upper electrode 15 at a room temperature by a sputtering method.

A TMR characteristic of the manufactured multi-layered structure may be improved by performing a suitable heat treatment. Finally, the multi-layered structure may be formed into a pillar element shape by a general fine processing technique using an electron beam lithography process, a photolithography process, or an ion etching process, thereby forming a structure of which electrically conductive characteristics are evaluable.

Characteristics of the perpendicular magnetic layer and the perpendicular magnetization-type MTJ element structure using the same according to some embodiments of the inventive concepts will be described hereinafter.

[Embodiment 1]

(Magnetic Characteristics)

Figure 4A:
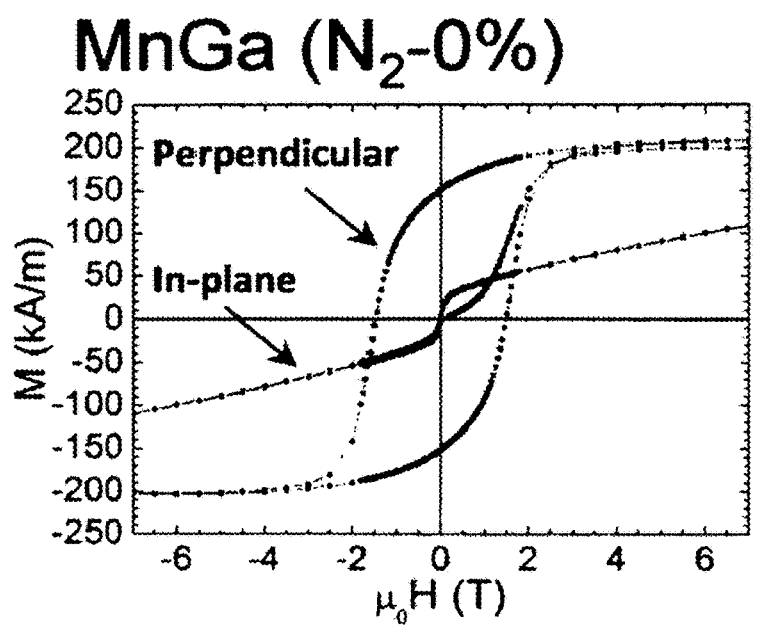
FIG. 4A is a graph illustrating magnetic characteristics of $Mn_{75}Ga_{25}$ (without $N_2$) formed on a magnesium oxide (MgO) substrate.
Figure 4B:
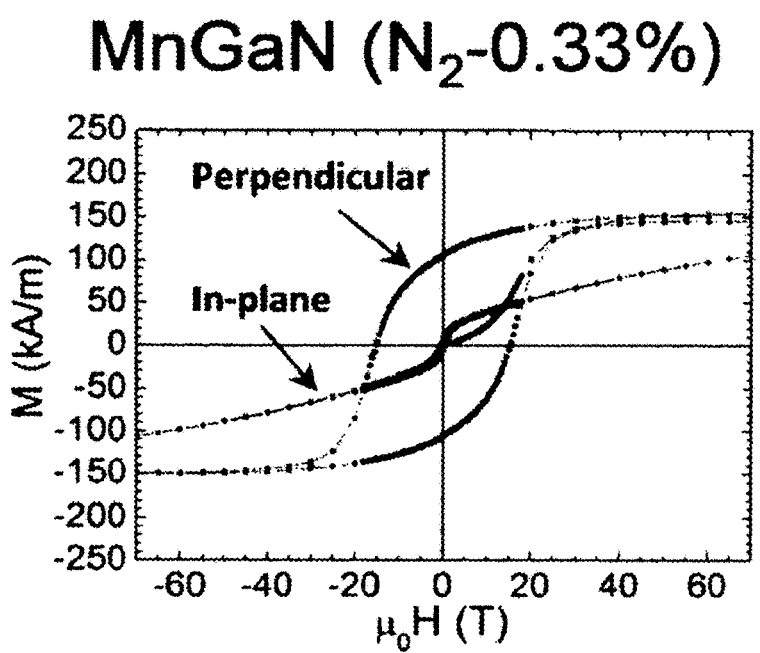
FIG. 4B is a graph illustrating magnetic characteristics of $Mn_{75}Ga_{25}$—N ($N_2$: 0.33%).

Magnetic characteristics of the Mn—Ga—N layer formed on the MgO substrate by the manufacturing method (B) described above will be described. FIGS. 4A and 4B illustrate magnetization curves of a MnGa(N) layer which was formed on the MgO (001) substrate of FIG. 1 at the substrate temperature (Ts) of 480 degrees Celsius by a sputtering method using a $Mn_{70}Ga_{30}$ target. A design thickness of the MnGa(N) layer was 50 nm. Here, the terms "In-plane" and "Perpendicular" mean values measured by applying an external magnetic field ($\mu_0 H$) in an in-plane direction and a direction perpendicular to a plane, respectively. Here, according to the analysis using an inductively coupled plasma method, an atomic ratio of Mn:Ga was 75%:25%. FIG. 4A illustrates the magnetization curves of the Mn—Ga layer formed by performing the sputtering process using the MnGa target under a condition that the nitrogen gas ratio ($\eta$) is 0% (no nitrogen). FIG. 4B illustrates the magnetization curves of the Mn—Ga—N layer formed by performing the sputtering process using the MnGa target under a condition that the nitrogen gas ratio ($\eta$) is 0.33%. These correspond to the magnetization curves of only the Mn—Ga(—N) layers, which are obtained by removing background signals occurring from the substrate. The both layers clearly show square-shaped good magnetic hysteresis when the magnetic field is applied in the direction perpendicular to the plane. Meanwhile, when the in-plane magnetic field is applied, it is difficult to saturate magnetization. Thus, an easy magnetization direction of the perpendicular magnetic layer is the direction perpendicular to the plane.

Referring to FIGS. 4A and 4B, a magnetic anisotropy energy density ($K_u$) was about 1.8 MJ/m$^3$ before nitrification and was about 1 MJ/m$^3$ after the nitrification ($\eta$=0.33%). Thus, a high magnetic anisotropy energy density ($K_u$) was obtained after the nitrification. When the sputtering process was performed using the Mn—Ga target under a condition of the nitrogen gas ratio of 1%, the magnetic anisotropy energy density ($K_u$) was lowered to 0.2 MJ/m$^3$, and thus an E2$_1$ perovskite structure was formed. When the sputtering process was performed using the Mn—Ga target under a condition of the nitrogen gas ratio of 3%, there was no clear difference between the magnetization curves of the in-plane direction and the perpendicular direction, and magnetic hysteresis was not shown, unlike the case in which the nitrogen gas ratio was low. Thus, a ferromagnetic property is changed into an anti-ferromagnetic property by the increase in the nitrogen amount of Mn—Ga—N.

(Crystal Structure)

Figure 5A:
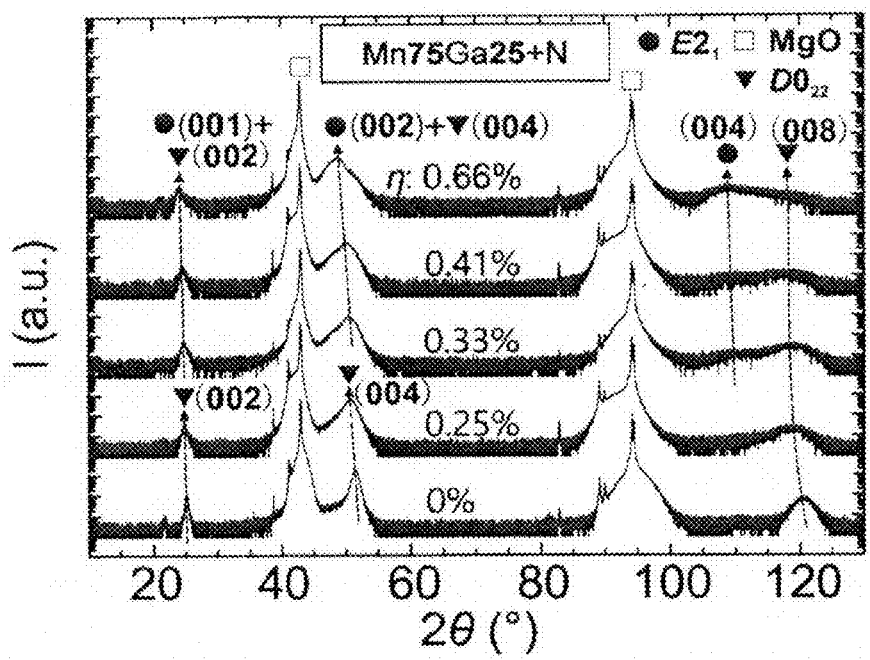
FIG. 5A is a graph illustrating each X-ray diffraction (XRD) according to a nitrogen amount ($\eta$) of $Mn_{75}Ga_{25}$—N formed on an MgO substrate.

FIG. 5A illustrates influence of an X-ray diffraction (XRD) profile of the Mn—Ga(—N) layer according to the nitrogen amount ($\eta$). Referring to FIG. 5A, the Mn—Ga—N layer of the nitrogen amount ($\eta$) of 0.25% was the D0$_{22}$ type like the Mn—Ga layer ($\eta$=0%). When the nitrogen amount ($\eta$) was equal to or greater than 0.33%, a perovskite phase (E2$_1$) coexisted with the D0$_{22}$ phase. When $\eta$=0.66%, the E2$_1$ phase was a main phase in the layer.

Figure 5B:
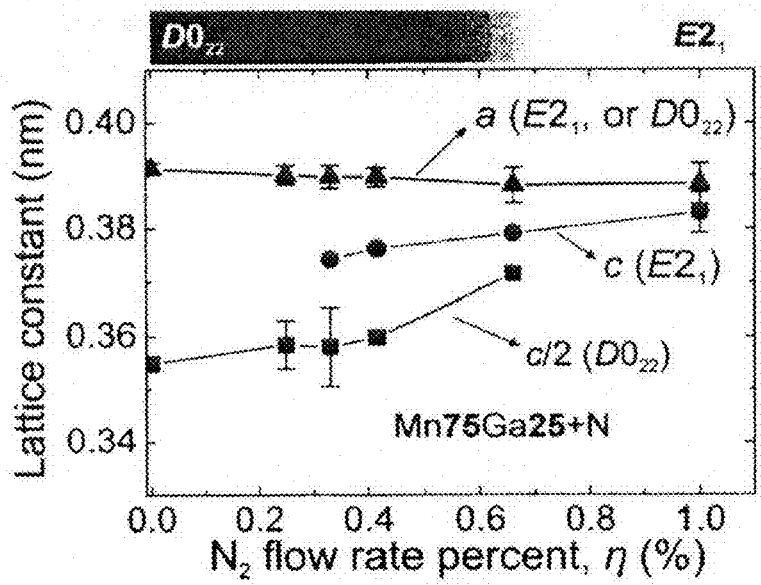
FIG. 5B is a graph illustrating in-plane lattice constants a and perpendicular lattice constants c of a $D0_{22}$ structure and an $E2_1$ structure obtained from XRD.
Figure 6:
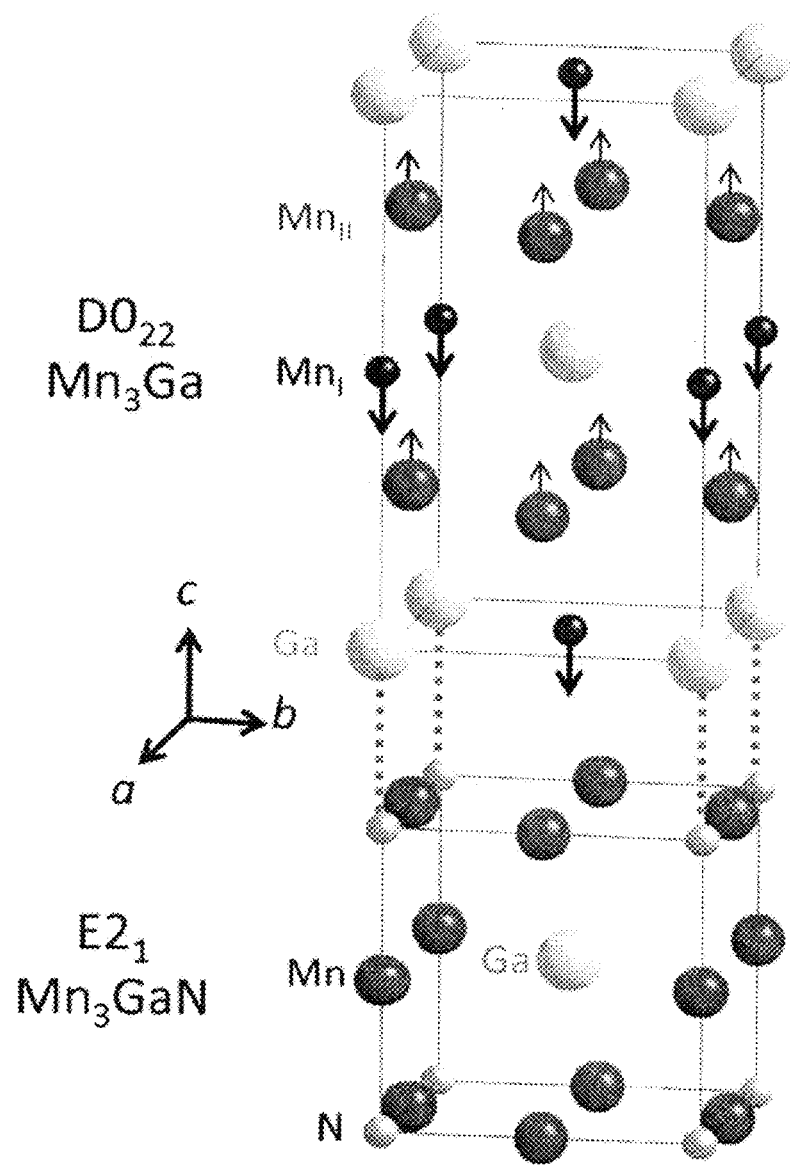
FIG. 6 is a schematic diagram illustrating a crystal structure of $D0_{22}$-$Mn_3Ga$ and $E2_1$-$Mn_3GaN$.

FIG. 5B illustrates in-plane lattice constants a and perpendicular lattice constants c of the D0$_{22}$ structure and the E2$_1$ structure, which are determined from the XRD profile of the Mn—Ga(—N) layer. The D0$_{22}$ is plotted as c/2. Referring to FIG. 5B, the lattice constant a does not depend on $\eta$, and the lattice constants a of the D0$_{22}$ and E2$_1$ structures are equal to each other. On the other hand, c/2 of the D0$_{22}$ structure increases according to $\eta$. The lattice constant c of the E2$_1$ structure is greater than c/2 of the D0$_{22}$ structure. This behavior can be understood from correspondence relationship of crystal structures illustrated in the schematic diagram of FIG. 6. In FIG. 6, the reference designators Mn$_I$ and Mn$_{II}$ of the D0$_{22}$ structure are used to distinguish Mn atoms respectively located at two symmetric positions. In-plane lattice constants a and b of Mn$_3$Ga having the D0$_{22}$ structure are approximately equal to those of Mn$_3$GaN having the E2$_1$ structure. Since the layer is grown while maintaining the (001) plane orientation by these reasons, it is possible to continuously change the structure from the D0$_{22}$ structure to the E2$_1$ structure without substantially changing an in-plane crystal structure. Since the D0$_{22}$ structure is similar to the E2$_1$ structure, a small amount of N atoms may be introduced into between Mn-Mn atoms of the D0$_{22}$ structure to increase the perpendicular lattice constant c according to $\eta$. Thus, when the amount of the introduced nitrogen is small, the D0$_{22}$ structure having a high magnetic anisotropy energy density ($K_u$) may be maintained.

Figure 7A:
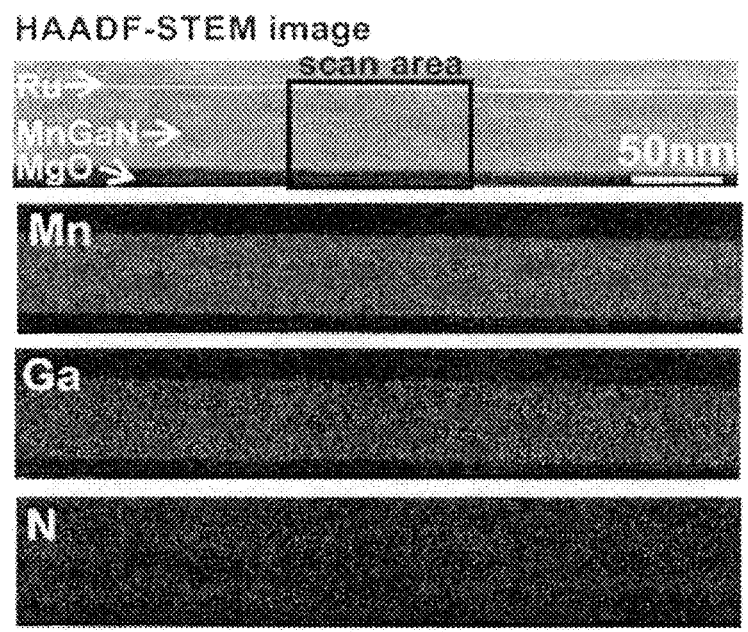
FIG. 7A illustrates a HAADF-STEM image of a cross section of $Mn_{75}Ga_{25}$—N ($N_2$: 0.33%) and an image of an EDS element map for each element of Mn, Ga, and N.
Figure 7B:
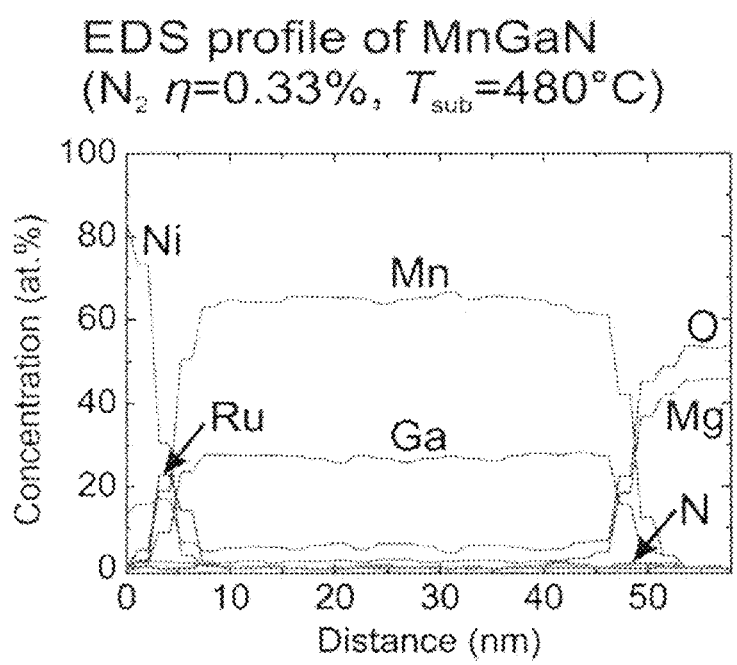
FIG. 7B is a graph illustrating an element ratio profile of a scan area of the HAADF-STEM image.

FIGS. 7A and 7B illustrate an electron microscope image (HAADF-STEM image) of a cross section of the Mn—Ga—N layer ($\eta$=0.33%) and element analysis results obtained by energy dispersive X-ray spectroscopy (EDS), respectively. Referring to FIG. 7A, each element of Mn, Ga, and N is uniformly dispersed throughout the layer. FIG. 7B illustrates a profile of each element in the direction perpendicular to the plane in the scan area of FIG. 7A. A composition of the MnGaN layer was (Mn$_{1-x}$Ga$_x$)N$_y$, where x=0.3 and y=0.005.

(Surface Structure)

Figure 8A:
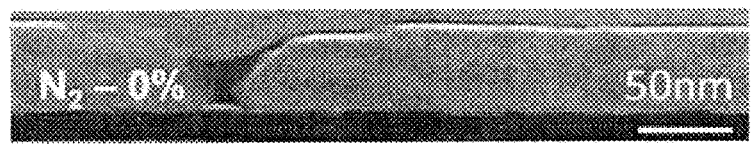
FIG. 8A is a STEM image of a cross section of $Mn_{75}Ga_{25}$ (without $N_2$).
Figure 8B:
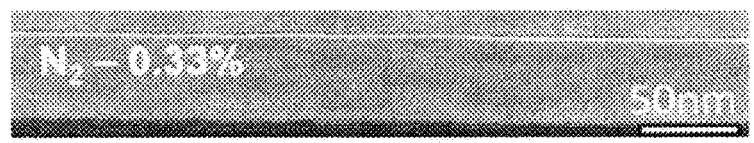
FIG. 8B is a STEM image of a cross section of $Mn_{75}Ga_{25}$—N ($N_2$: 0.33%).

As a result of observing an area of 1×1 $\mu$m$^2$ by an atomic force microscope (AFM), a surface average roughness ($R_a$) was reduced from 1.76 nm ($\eta$=0%, see FIG. 8A) to 0.48 nm ($\eta$=0.33%, see FIG. 8B). In other words, flatness was improved. This is recognized by STEM images of FIGS. 8A and 8B. When $\eta$=0%, the flatness was deteriorated by a hole extending to a surface of the substrate. However, when $\eta$=0.33%, a very flat structure was obtained by the introduced nitrogen. Thus, the layer structure suitable as the perpendicular magnetic layer for the MTJ element is obtained.

[Embodiment 2]

A layer of a thickness of 50 nm was formed at a temperature of 480 degrees Celsius by magnetron sputtering, and the ratio ($\eta$) of nitrogen (N$_2$) to the argon gas was changed into a range of 0.25% to 0.66%. In this case, relationships with a composition ratio of Mn-Ga were evaluated. A MnGa layer of Mn$_{71}$Ga$_{29}$ was evaluated in addition to Mn$_{75}$Ga$_{25}$ of the embodiment 1.

Figure 9A:
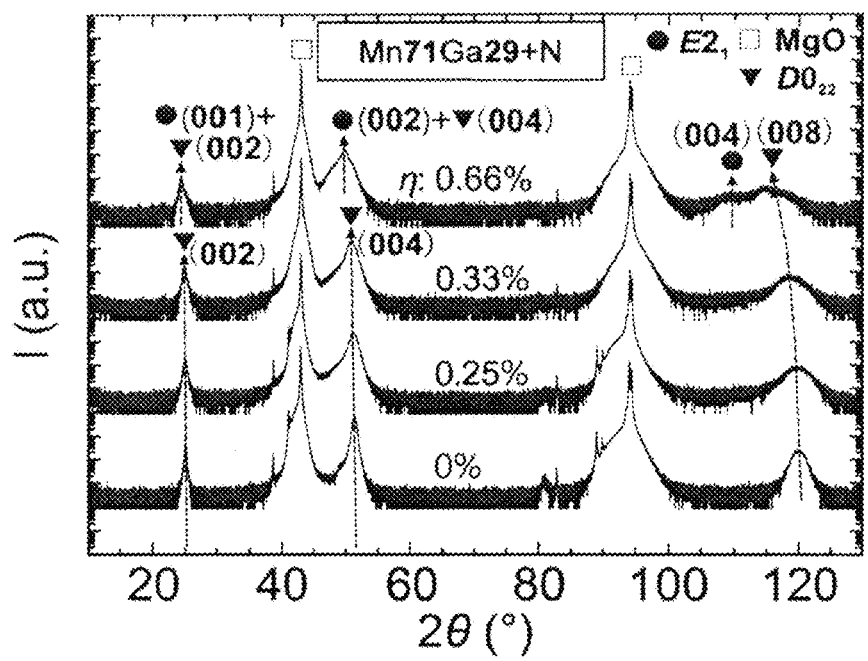
FIG. 9A is a graph illustrating each X-ray diffraction (XRD) according to a nitrogen amount (TO) of $M_{71}Ga_{29}$—N formed on an MgO substrate.
Figure 9B:
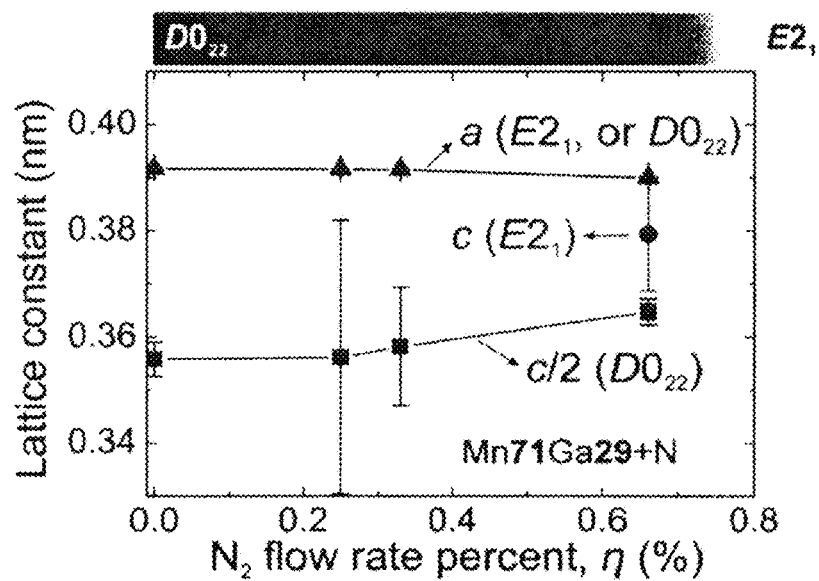
FIG. 9B is a graph illustrating in-plane lattice constants a and perpendicular lattice constants c of a $D0_{22}$ structure and an $E2_1$ structure obtained from XRD.

FIG. 9A illustrates results of X-ray diffraction (XRD) according to a change of the N$_2$ ratio ($\eta$) with respect to Mn$_{71}$Ga$_{29}$. Unlike the results of Mn$_{75}$Ga$_{25}$ illustrated in FIG. 5A, the D0$_{22}$ structure is stably obtained at a higher $\eta$. When $\eta$=0.33%, the E2$_1$ perovskite structure is not shown but the D0$_{22}$ structure is obtained in a single phase. FIG. 9B illustrates the change of lattice constants a and c by $\eta$. In this composition, the lattice constant a does not depend on $\eta$, and the lattice constant c shows a tendency to increase with an increase in $\eta$.

Figure 10A:
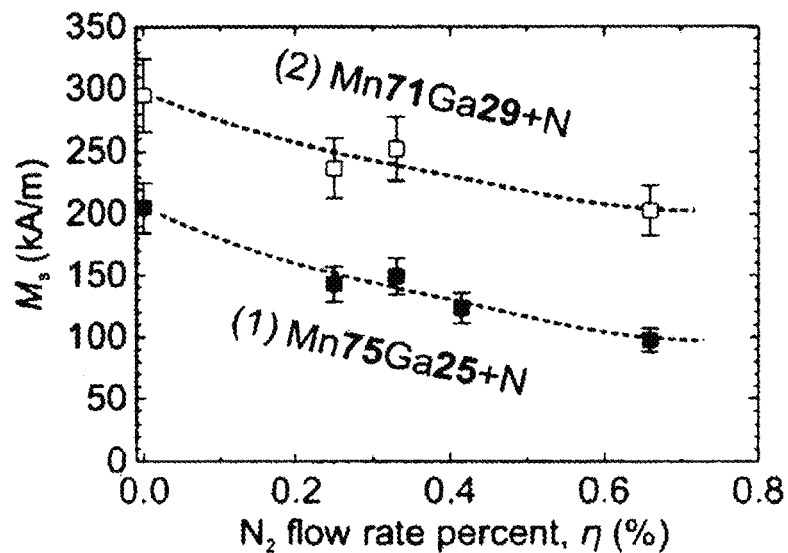
FIGS. 10A to 10C are graphs respectively illustrating saturation magnetizations ($M_s$), magnetic anisotropy energy densities ($K_u$) and average roughnesses ($R_a$) depending on a $N_2$ amount in $Mn_{75}Ga_{25}$—N and $Mn_{71}Ga_{29}$—N.
Figure 10B:
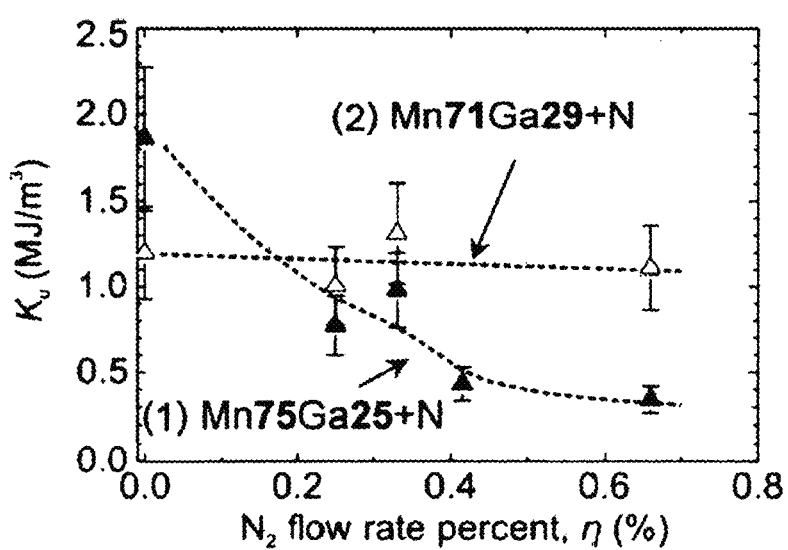
Figure 10C:
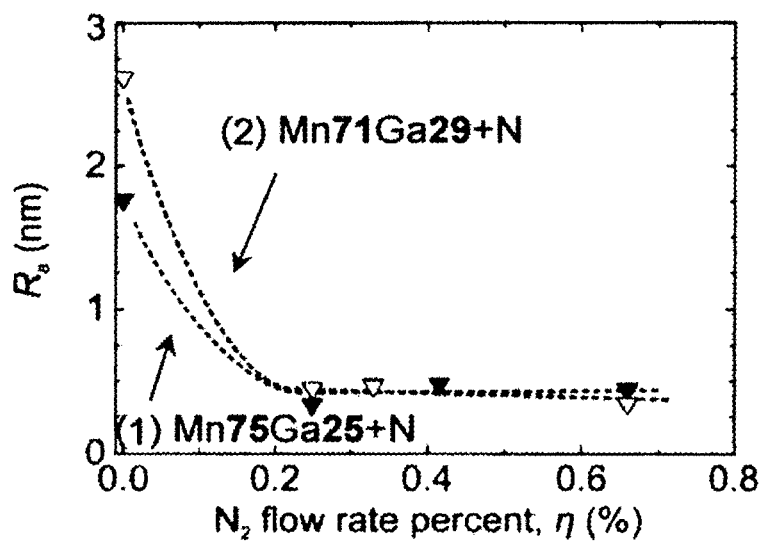

FIGS. 10A to 10C illustrate saturation magnetizations ($M_s$), magnetic anisotropy energy densities ($K_u$), and average roughnesses ($R_a$), depending on a nitrogen amount ($\eta$), of a composition (1) Mn$_{75}$Ga$_{25}$ and a composition (2) Mn$_{71}$Ga$_{29}$, respectively. The saturation magnetization ($M_s$) may be reduced by an increase in $\eta$. Since a ratio of Mn$_I$ to Mn$_{II}$ in the D0$_{22}$ Mn$_3$Ga crystal lattice of FIG. 6 is changed by a Mn—Ga composition ratio, magnitudes of the saturation magnetizations ($M_s$) of the compositions (1) and (2) are different from each other. Magnetic moments of Mn$_I$ and Mn$_{II}$ partially offset each other as shown by the arrows of FIG. 6. Thus, when a Mn amount is small, the saturation magnetization ($M_s$) of the composition (2) increases by a decrease in the offset. As a result, the magnetization may be changed by the composition ratio of Mn—Ga and may also be changed by the nitrogen amount. In the composition (2) in which the Mn amount is relatively small, a strong perpendicular magnetic anisotropy energy density ($K_u$) is maintained at a higher $\eta$ since the D0$_{22}$ structure is more stable. On the other hand, the average roughnesses ($R_a$) are sufficiently small in both the compositions (1) and (2) when η is equal to or greater than 0.25%.

Figure 11A:
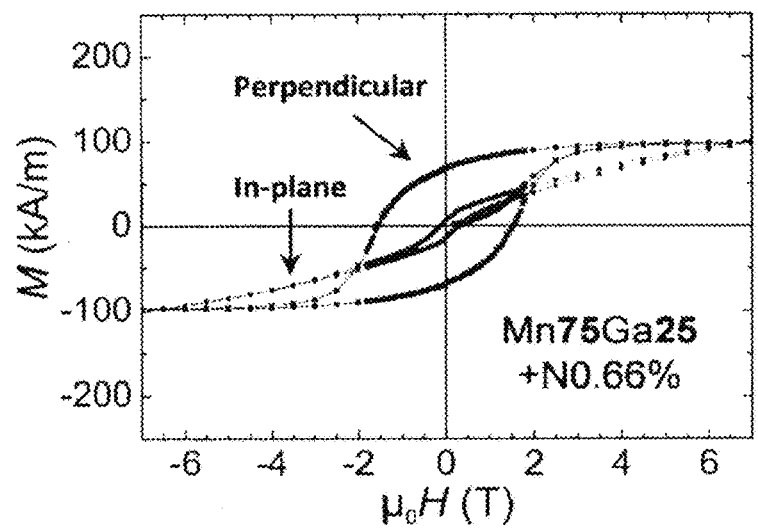
FIGS. 11A and 11B are graphs respectively illustrating magnetic characteristics of $Mn_{75}Ga_{25}$—N and $Mn_{71}Ga_{29}$—N when nitrogen amount ($\eta$)=0.66%.
Figure 11B:
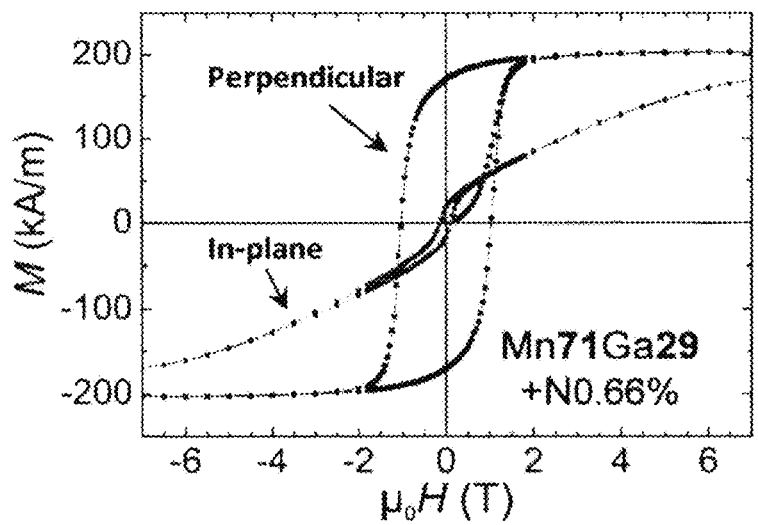

FIGS. 11A and 11B illustrate magnetization curves of the composition (1) $Mn_{75}Ga_{25}$ and the composition (2) $Mn_{71}Ga_{29}$, respectively, when η=0.66%. Since a magnitude of the magnetic anisotropy energy density ($K_u$) is proportional to a size of an area of a y-axis surrounded by each of the perpendicular curve and the in-plane curve, the composition (2) has a higher magnetic anisotropy energy density ($K_u$). Thus, the composition (2) is a better perpendicular magnetic layer.

As described above, the flatness may be realized by introducing a very small amount of nitrogen, and the magnetic anisotropy energy density ($K_u$) may be maintained high by adjusting the Mn composition ratio. Thus, the compositions according to the inventive concepts are suitable as the perpendicular magnetic layer for the MTJ element.

COMPARATIVE EXAMPLE 1

Next, a comparison with a composition formed using a higher nitrogen amount will be described (Non-patent document 3). A MnGaN layer was obtained using $Mn_{75}Ga_{25}$ at a substrate temperature (Ts) of 480 degrees Celsius under a condition of a nitrogen amount (η) of 1%. This MnGaN layer had the $E2_1$ structure, and thus a magnetic anisotropy energy density ($K_u$) was small ($K_u$=0.1 MJ/m³). By EDS analysis, it was recognized that this MnGaN layer had a composition formula of $(Mn_{1-x}Ga_x)N_y$, where x=0.36 and y=0.12. Thus, in a case in which y is greater than 0.1, it is difficult to maintain the $D0_{22}$ structure, and a high magnetic anisotropy energy density ($K_u$) is not exhibited.

According to some embodiments of the inventive concepts, the perpendicular magnetic layer may be uniformly formed by adjusting the nitrogen amount. The perpendicular magnetic layer may have high flatness, high magnetic anisotropy, and low saturation magnetization. The perpendicular magnetic layer may be variously modified using the nitrogen amount, and a coercive force of the perpendicular magnetic layer may be similar to that of a perpendicular magnetic layer not having nitrogen. In addition, the perpendicular magnetic layer may have a high quality by the high flatness and may be thinned by the high flatness. As a result, the high-quality perpendicular magnetization-type MTJ element can be provided.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A perpendicular magnetic layer comprising:
   a composition represented by a chemical formula of $(Mn_{1-x}M_x)N_y$, where 'M' is at least one of gallium (Ga) or germanium (Ge), 0<x≤0.5, and 0.005 ≤y<0.1,
   wherein the composition has a $D0_{22}$ or $L1_0$ crystal structure.

2. The perpendicular magnetic layer of claim 1, wherein 0.2<x<0.4.

3. The perpendicular magnetic layer of claim 1, wherein 0.005≤y<0.05.

4. The perpendicular magnetic layer of claim 1, wherein 0.005≤y<0.02.

5. The perpendicular magnetic layer of claim 1, wherein the perpendicular magnetic layer is vapor-grown on a substrate.

6. The perpendicular magnetic layer of claim 5, wherein the substrate is a single-crystalline substrate having a cubic system structure having a (001) plane orientation or a layer having a cubic system structure having a (001) plane orientation.

7. The perpendicular magnetic layer of claim 1, wherein the perpendicular magnetic layer is vapor-grown on an underlayer.

8. The perpendicular magnetic layer of claim 7, wherein the underlayer is a non-magnetic layer grown in a single-crystalline state or an electrically conductive layer grown in a single-crystalline state.

9. A magnetic device comprising:
   a first perpendicular magnetic layer disposed on a substrate,
   wherein the first perpendicular magnetic layer is represented by a chemical formula of $(Mn_{1-x}M_x)N_y$, where 'M' is at least one of gallium (Ga) or germanium (Ge), 0<x≤0.5, and 0.005≤y<0.1, and
   wherein the first perpendicular magnetic layer has a $D0_{22}$ or $L1_0$ crystal structure.

10. The magnetic device of claim 9, further comprising:
    an underlayer between the substrate and the first perpendicular magnetic layer,
    wherein the underlayer is a single-crystalline non-magnetic layer or a single-crystalline conductive layer.

11. The magnetic device of claim 9, further comprising:
    a non-magnetic layer on the first perpendicular magnetic layer.

12. The magnetic device of claim 11, further comprising:
    an insertion layer disposed between the non-magnetic layer and the first perpendicular magnetic layer, the insertion layer having a cubic system structure having a (001) plane orientation.

13. The magnetic device of claim 11, further comprising:
    a second perpendicular magnetic layer on the non-magnetic layer.

14. The magnetic device of claim 13, wherein the second perpendicular magnetic layer is represented by a chemical formula of $(Mn_{1-x}M_x)N_y$, where 'M' is at least one of gallium (Ga) or germanium (Ge), 0<x0.5, and 0.005 ≤y<0.1, and
    wherein the second perpendicular magnetic layer has a $D0_{22}$ or $L1_0$ crystal structure.

15. The magnetic device of claim 13, wherein the second perpendicular magnetic layer includes a different material from the first perpendicular magnetic layer.

16. The magnetic device of claim 13, further comprising:
    an upper electrode on the second perpendicular magnetic layer.

17. The perpendicular magnetic layer of claim 1, wherein the composition includes a composition ratio of Mn to Ga that is 75%:25%.

18. The perpendicular magnetic layer of claim 1, wherein the composition includes a composition ratio of Mn to Ga that is 71%:29%.

19. The magnetic device of claim 9, wherein the first perpendicular magnetic layer includes a composition ratio of Mn to Ga that is 75% : 25%.

20. The magnetic device of claim 9, wherein the first perpendicular magnetic layer includes a composition ratio of Mn to Ga that is 71%:29%.

* * * * *